(12) United States Patent
Won et al.

(10) Patent No.: US 10,998,082 B2
(45) Date of Patent: *May 4, 2021

(54) MEMORY SYSTEM FOR ACTIVATING REDUNDANCY MEMORY CELL AND OPERATING METHOD THEREOF

(71) Applicant: SK hynix Inc., Icheon (KR)

(72) Inventors: Hyung-Sik Won, Cheongju (KR); Hyungsup Kim, Yongin (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/568,111

(22) Filed: Sep. 11, 2019

(65) Prior Publication Data

US 2020/0005888 A1 Jan. 2, 2020

Related U.S. Application Data

(63) Continuation of application No. 16/044,322, filed on Jul. 24, 2018, now Pat. No. 10,435,550.

(30) Foreign Application Priority Data

Oct. 31, 2017 (KR) .................. 10-2017-0143429

(51) Int. Cl.
*G11C 16/06* (2006.01)
*G11C 29/00* (2006.01)
(Continued)

(52) U.S. Cl.
CPC ........ *G11C 29/783* (2013.01); *G11C 13/0097* (2013.01); *G11C 16/30* (2013.01);
(Continued)

(58) Field of Classification Search
CPC ..................................................... G11C 29/44
(Continued)

(56) References Cited

U.S. PATENT DOCUMENTS 5,657,281 A * 8/1997 Rao .................. G11C 29/808
365/200
5,867,642 A 2/1999 Vivio et al.
(Continued)

FOREIGN PATENT DOCUMENTS

KR 1020160141484 A 12/2016

OTHER PUBLICATIONS

Office Action dated Apr. 2, 2020 for U.S. Appl. No. 16/122,615.
Notice of Allowance dated Dec. 7, 2020 for U.S. Appl. No. 16/122,615.

*Primary Examiner* — Hoai V Ho

(57) ABSTRACT

A memory system includes a memory device and a controller. The memory device includes a memory cell array including a normal memory cell area and a redundancy memory cell area, the redundancy memory cell area having a replacement memory cell region and a reserved memory cell region; a register suitable for generating a first signal indicating existence of the reserved memory cell region; and a fuse unit suitable for activating the reserved memory cell region based on the first signal. The controller assigns an address for accessing a reserved memory cell of the reserved memory cell region based on the first signal. A replacement memory cell in the replacement memory cell region replaces a failed memory cell in the normal memory cell region, and the reserved memory cell in the reserved memory cell region remains without replacing any failed memory cell in the normal memory cell region.

20 Claims, 5 Drawing Sheets

(51) Int. Cl.
*G11C 29/44* (2006.01)
*G11C 16/34* (2006.01)
*G11C 13/00* (2006.01)
*G11C 16/30* (2006.01)
*G11C 29/52* (2006.01)
*G11C 29/04* (2006.01)

(52) U.S. Cl.
CPC ............ *G11C 16/349* (2013.01); *G11C 29/44* (2013.01); *G11C 29/52* (2013.01); *G11C 29/76* (2013.01); *G11C 29/785* (2013.01); *G11C 29/835* (2013.01); *G11C 2029/0411* (2013.01); *G11C 2207/2236* (2013.01)

(58) Field of Classification Search
USPC ..................................................... 365/185.09
See application file for complete search history.

(56) References Cited

U.S. PATENT DOCUMENTS

| | | | |
|---|---|---|---|
| 6,466,509 | B1 | 10/2002 | Tanizaki et al. |
| 7,808,823 | B2 * | 10/2010 | Ma ....................... G11C 29/789 |
| | | | 365/185.09 |
| 10,453,550 | B2 * | 10/2019 | Won ....................... G11C 29/52 |
| 2006/0143428 | A1 | 6/2006 | Noda et al. |
| 2007/0064489 | A1 | 3/2007 | Bauser |
| 2010/0325351 | A1 | 12/2010 | Bennett |
| 2013/0286759 | A1 * | 10/2013 | Park ......................... G11C 8/10 |
| | | | 365/201 |
| 2013/0311709 | A1 | 11/2013 | Im et al. |
| 2013/0329506 | A1 | 12/2013 | Jeong |
| 2017/0092366 | A1 | 3/2017 | Hwang et al. |
| 2017/0269989 | A1 * | 9/2017 | Kim .................... G06F 11/1048 |
| 2018/0059937 | A1 * | 3/2018 | Kim ........................ G06F 3/065 |

* cited by examiner

MEMORY SYSTEM FOR ACTIVATING REDUNDANCY MEMORY CELL AND OPERATING METHOD THEREOF

CROSS-REFERENCE TO RELATED APPLICATIONS

The present application is a continuation of U.S. application Ser. No. 16/044,322, filed Jul. 24, 2018, which claims priority under 35 U.S.C. § 119(a) to Korean Patent Application No. 10-2017-0143429 filed on Oct. 31, 2017, the disclosure of which is incorporated by reference herein in its entirety.

BACKGROUND

1. Field

Various embodiments of the present disclosure relate to a memory system. Particularly, embodiments relate to a memory system capable of efficiently processing data, and an operating method thereof.

2. Description of the Related Art

The paradigm for computing environments moves toward ubiquitous computing which allows people or users to use their or commonly supplied computing systems anytime and everywhere. In the era of ubiquitous computing, the demand for portable electronic devices, such as mobile phones, digital cameras, and laptop computers, is soaring. Such a portable electronic device generally includes a memory system using a memory device as a data storage device. The data storage device may be used as a main memory unit or an auxiliary memory unit of the portable electronic device.

Since a data storage device using a memory device does not have a mechanical driving unit (e.g., a mechanical arm with a read/write head) as compared with a hard disk device, it may have excellent stability and durability. Also, the data storage device can have a quick data access rate with low power consumption compared to the hard disk device. The data storage device having such advantages includes any of a Universal Serial Bus (USB) memory device, a memory card having diverse interfaces, a Solid-State Drive (SSD), and the like.

A memory device may include a plurality of memory cells. As the process technology develops, the degree of integration of the memory device increases, and thus the number of memory cells in the memory device may be further increased.

If any one of these memory cells is defective, the memory device having the defective memory cell may not perform a normal operation and should be discarded. However, as the process technology develops, defects occur only in a small number of memory cells. Therefore, it is inefficient considering the yield of the product to dispose of a memory device as a defective product because of a small number of defective memory cells in the memory device. Accordingly, in order to compensate for this inefficiency, a memory device may include redundancy memory cells in addition to normal memory cells.

When a defect occurs in a normal memory cell, a redundancy memory cell may replace a defective normal memory cell, that is, a failed memory cell. A redundancy memory cell replaced with a failed memory cell among redundancy memory cells is called a replaced memory cell. Other redundancy memory cells that remain not replaced with failed memory cells are referred to as reserved memory cells. For an efficient memory device operation, a method is needed to properly use the reserved memory cells.

SUMMARY

Various embodiments of the present disclosure are directed to a memory system capable of efficiently using redundancy memory cells and an operating method thereof.

In accordance with an embodiment of the present invention, a memory system may include a memory device including: a memory cell array including a normal memory cell area and a redundancy memory cell area, the redundancy memory cell area having a replacement memory cell region and a reserved memory cell region; a register suitable for generating a first signal indicating existence of the reserved memory cell region; and a fuse unit suitable for activating the reserved memory cell region based on the first signal; and a controller suitable for assigning an address for accessing a reserved memory cell of the reserved memory cell region based on the first signal, wherein a replacement memory cell in the replacement memory cell region replaces a failed memory cell in the normal memory cell region, and the reserved memory cell in the reserved memory cell region remains without replacing any failed memory cell in the normal memory cell region.

In accordance with an embodiment of the present invention, an operating method of a memory system may include generating a first signal indicating existence of a reserved memory cell region in a memory cell array included in a memory device; assigning an address for accessing a reserved memory cell in the reserved memory cell region based on the first signal; activating the reserved memory cell region based on the first signal; and controlling the memory device based on the address assigned to the reserved memory cell, wherein the memory cell array includes a redundancy memory cell area and a normal memory cell area, and wherein the redundancy memory cell area includes a replacement memory cell region and the reserved memory cell region, the replacement memory cell region including a replacement memory cell for replacing a failed memory cell in the normal memory cell area, the reserved memory cell region including the reserved memory cell that remains without replacing any failed normal memory cell in the normal memory cell area.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
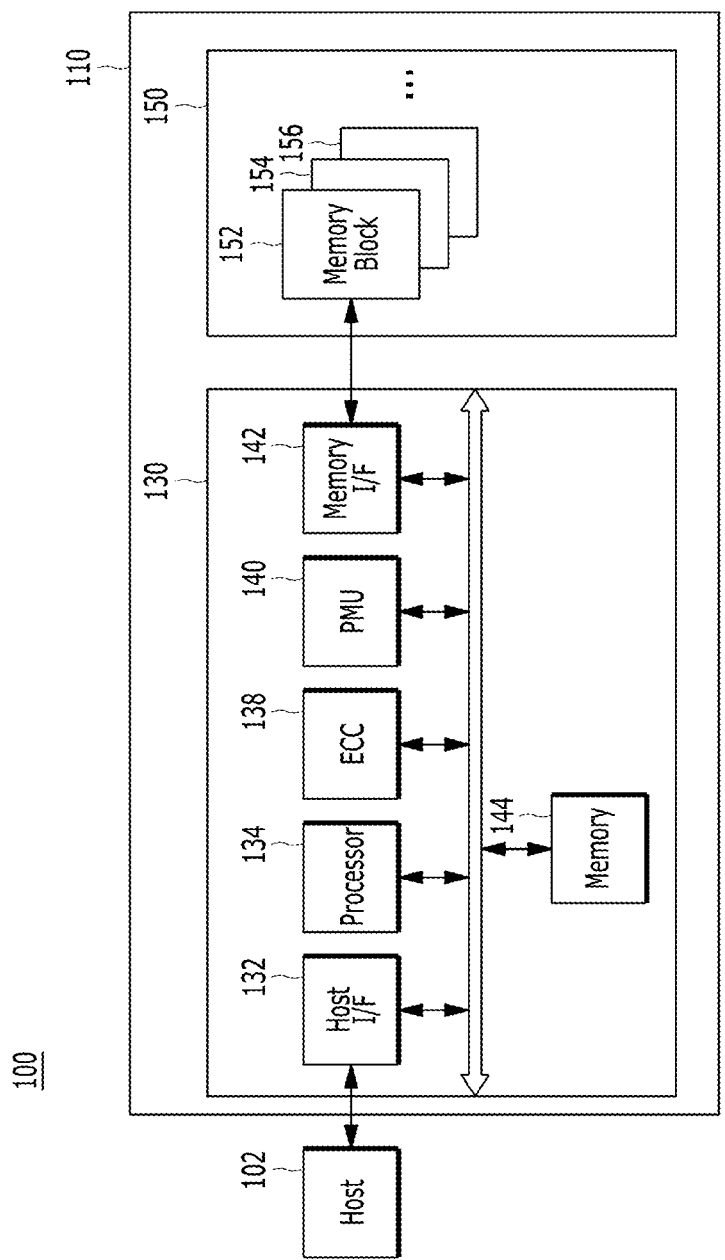
FIG. 1 is a block diagram illustrating a data processing system including a memory system in accordance with an embodiment of the present disclosure.

Various embodiments of the present disclosure are described below in more detail with reference to the accompanying drawings. The disclosure may be embodied in different other embodiments, forms, and variations thereof, and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure.

It will be understood that, although the terms "first," "second," "third," and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to," or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present disclosure.

Referring to FIG. 1, the data processing system 100 may include a host 102 operatively coupled to a memory system 110.

The host 102 may include, for example, a portable electronic device, such as a mobile phone, an MP3 player, or a laptop computer, or an electronic device, such as a desktop computer, a game player, a TV, a projector, or the like.

The memory system 110 may perform a specific function or operation in response to a request from the host 102, and may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of the storage devices include a solid state drive (SSD), a multimedia card (MMC), an embedded MMC (eMMC), a reduced size MMC (RS-MMC) or micro-MMC, a secure digital (SD) card, a mini-SD or micro-SD, a universal serial bus (USB) storage device, a universal flash storage (UFS) device, a compact flash (CF) card, a smart media (SM) card, a memory stick, and the like.

The storage device for the memory system 110 may be implemented with a volatile memory device, such as any of a dynamic random access memory (DRAM) and a static RAM (SRAM), and/or a nonvolatile memory device such as any of a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a memory device 150, which stores data to be accessed by the host 102, and a controller 130, which may control an operation for storing data in the memory device 150.

The controller 130 and the memory device 150 may be integrated into a single semiconductor device, which may be any of the various types of memory systems described above.

The memory system 110 may be configured as a part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, any of various electronic devices configuring a computer network, any of various electronic devices configuring a telematics network, a radio frequency identification (RFID) device, or any of various components configuring a computing system.

The memory device 150 may be a nonvolatile memory device, and may retain data stored therein even when an electrical power is not supplied. The memory device 150 may store data provided from the host 102 in a write operation, and provide data stored therein to the host 102 in a read operation. The memory device 150 may include a plurality of memory blocks 152 to 156, each of the memory blocks 152 to 156 may include a plurality of pages. Each of the plurality of pages may include a plurality of memory cells to which a corresponding one of a plurality of word lines (WL) is electrically coupled.

The controller 130 may control overall operations of the memory device 150, such as read, write, program, and erase operations. The controller 130 may control the memory device 150 in response to a request from the host 102. The controller 130 may provide data, read from the memory device 150, to the host 102, and/or may store data, provided by the host 102, into the memory device 150.

The controller 130 may include a host interface (I/F) unit 132, a processor 134, an error correction code (ECC) unit 138, a power management unit (PMU) 140, a memory device controller such as a memory interface (I/F) unit 142, and a memory 144, which are operatively coupled to each other through an internal bus.

The host interface unit 132 may process requests and data provided by the host 102, and may communicate with the host 102 through at least one of various interface protocols such as a universal serial bus (USB), a multimedia card (MMC), peripheral component interconnect-express (PCI-E), a small computer system interface (SCSI), a serial-attached SCSI (SAS), a serial advanced technology attachment (SATA), a parallel advanced technology attachment (PATA), a small computer system interface (SCSI), an enhanced small disk interface (ESDI), and integrated drive electronics (IDE). The host interface unit 132 may be driven by a firmware that is referred to as a "host interface layer (HIL)."

The ECC unit 138 may detect and correct errors in data read from the memory device 150 during a read operation. When the number of error bits is greater than or equal to a threshold number of correctable error bits, the ECC unit 138 may not correct the error bits, but may output an error correction fail signal indicating a failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or a combination thereof. The ECC unit 138 may include all or some of circuits, modules, systems, or devices for performing the error correction operation based on at least one of the above described codes.

The PMU 140 may provide power for operating the controller 130 and manage the power of the controller 130.

The memory interface unit 142 may serve as an interface for handling commands and data transferred between the controller 130 and the memory device 150, so as to allow the controller 130 to control the memory device 150 in response to a request from the host 102. The memory interface unit 142 may generate a control signal for controlling the memory device 150, and may process data to be written into or outputted from the memory device 150 under the control of the processor 134, when the memory device 150 is a flash memory and, in particular, when the memory device 150 is a NAND flash memory.

The memory 144 may serve as a working memory of the memory system 110, and may store temporary or transactional data for operating or driving the memory system 110. The controller 130 may control the memory device 150 in response to a request from the host 102. The controller 130 may deliver data read from the memory device 150 to the host 102, may store data from the host 102 in the memory device 150. The memory 144 may be used to store data required for the controller 130 and the memory device 150 in order to perform the read and write operations of the memory device 150.

The memory 144 may be implemented with a volatile memory. The memory 144 may be implemented with a static random access memory (SRAM) or a dynamic random access memory (DRAM). Although FIG. 1 illustrates the memory 144 that is disposed within the controller 130, embodiments are not limited thereto. That is, the memory 144 may be located inside or outside the controller 130. In another embodiment, the memory 144 may be embodied by an external volatile memory having a memory interface that transfers data and/or signals between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

A FTL may perform an operation as an interface between the host 102 and the memory device 150. The host 102 may transmit requests for write and read operations to the memory device 150 through the FTL.

The FTL may manage operations such as address mapping, garbage collection, wear-leveling, and so forth. Particularly, the FTL may store mapping data. Therefore, the controller 130 may perform an address mapping operation by mapping a logical address, which is provided by the host 102, to a physical address of the memory device 150 through the use of the mapping data. Also, through the address mapping operation based on the mapping data, when the controller 130 updates data on a particular page, the controller 130 may program new data on another empty page, and may invalidate old data on the particular page, due to a characteristic of a flash memory device that is the memory device 150. Further, the controller 130 may store mapping data for the new data into the FTL.

The processor 134 may be implemented with a microprocessor or a central processing unit (CPU). The memory system 110 may include one or more processors.

A management unit (not shown) may be included in the processor 134. The management unit may perform bad block management of the memory device 150. The management unit may find bad memory blocks included in the memory device 150 and perform bad block management on the bad memory blocks. The bad memory block is a memory block that is in an unsatisfactory condition for further use. When the memory device 150 is a flash memory, for example, a NAND flash memory, a program failure may occur during a write operation, for example, during a program operation, due to characteristics of a NAND logic function. During the bad block management, data of the program-failed memory block or the bad memory block may be programmed into a new memory block. The bad memory blocks may seriously aggravate the utilization efficiency of the memory device 150 having a 3D stack structure and the reliability of the memory system 110. To overcome these drawbacks, reliable bad block management is required.

Hereinafter, utilization of a reserved memory cell, which is not in use among redundancy memory cells, will be described.

Figure 2:
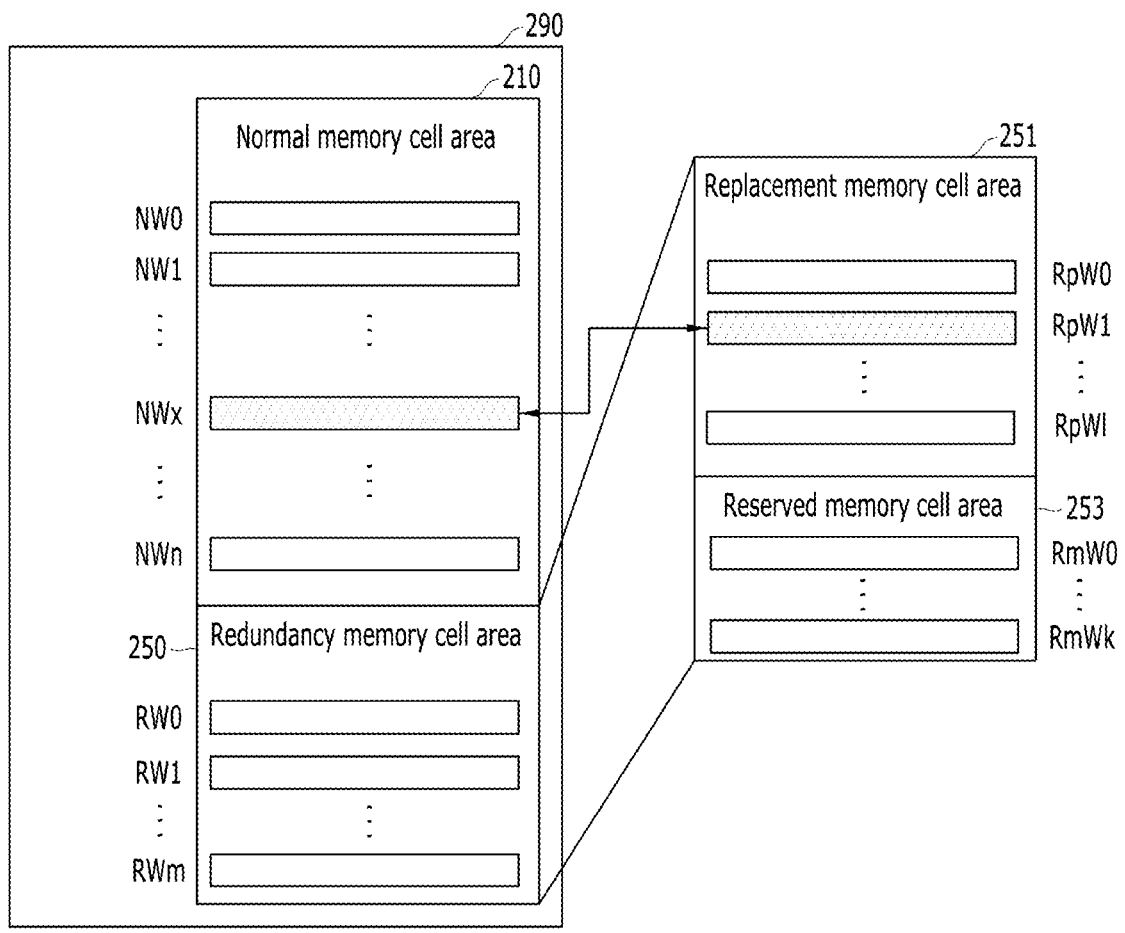
FIG. 2 is a schematic diagram illustrating a memory cell array of a memory device in accordance with an embodiment of the present disclosure.

FIG. 2 is a schematic diagram illustrating a structure of the memory device 150 shown in FIG. 1 in accordance with an embodiment of the present disclosure.

The memory device 150 may include a memory cell array 290. The memory cell array 290 may be divided into a normal memory cell area 210 and a redundancy memory cell area 250. A plurality of normal memory cells may be included in the normal memory cell area 210. The plurality of normal memory cells may be coupled to a plurality of normal word lines NW0 to NWn, n being a positive integer. When one of the plurality of normal word lines NW0 to NWn is activated, data may be written into or read out from a multiplicity of normal memory cells coupled to the activated normal word line.

A plurality of redundancy memory cells may be included in the redundancy memory cell area 250. The plurality of redundancy memory cells may be coupled to a plurality of redundancy word lines RW0 to RWm, m being a positive integer. When one of the plurality of redundancy word lines RW0 to RWm is activated, data may be written into or read out from a multiplicity of redundancy memory cells coupled to the activated redundancy word line.

The redundancy memory cell area 250 may be divided into a replacement memory cell region 251 and a reserved memory cell region 253. A plurality of replacement memory cells may be included in the replacement memory cell region 251. The plurality of replacement memory cells may be coupled to a plurality of replacement word lines RpW0 to RpWl, l being a positive integer. The plurality of replacement memory cells may replace a corresponding number of failed normal memory cells. For example, when a replacement target memory cell or a failed memory cell, which is coupled to the normal word line NWx, is detected in the normal memory cell area 210, the normal word line NWx coupled to the replacement target memory cell may be replaced by a replacement word line, e.g., the replacement word line RpW1, in the replacement memory cell region 251. A word line replacement operation of the memory system will be described in detail with reference to FIG. 3.

A plurality of reserved memory cells may be included in the reserved memory cell region 253. The plurality of reserved memory cells may be coupled to a plurality of reserved word lines RmW0 to RmWk, k being a positive integer. The plurality of reserved memory cells of the reserved memory cell region 253 are not used for replacing failed memory cells, and thus they may be wasted. That is, in the redundancy memory cell area 250, the remaining region other than the replacement memory cell region 251 in which the plurality of replacement memory cells are replaced with failed memory cells in the normal memory cell area 210 may be the reserved memory cell region 253. Therefore, the size of the reserved memory cell region 253 may be determined depending on a number of failed memory cells in the normal memory cell area 210. For example, when it is assumed that the redundancy memory cell area 250 occupies 3% of the memory cell array 290 1% of the memory cell array 290 is assigned as the replacement memory cell region 251 including the plurality of replacement memory cells that are replaced with failed memory cells, 2% of the memory cell array 290 remains as the reserved memory cell region 253. The reserved memory cell region 253 may be wasted. However, in accordance with an embodiment of the present disclosure, the reserved memory cell region 253 may be utilized without being wasted.

Figure 3:
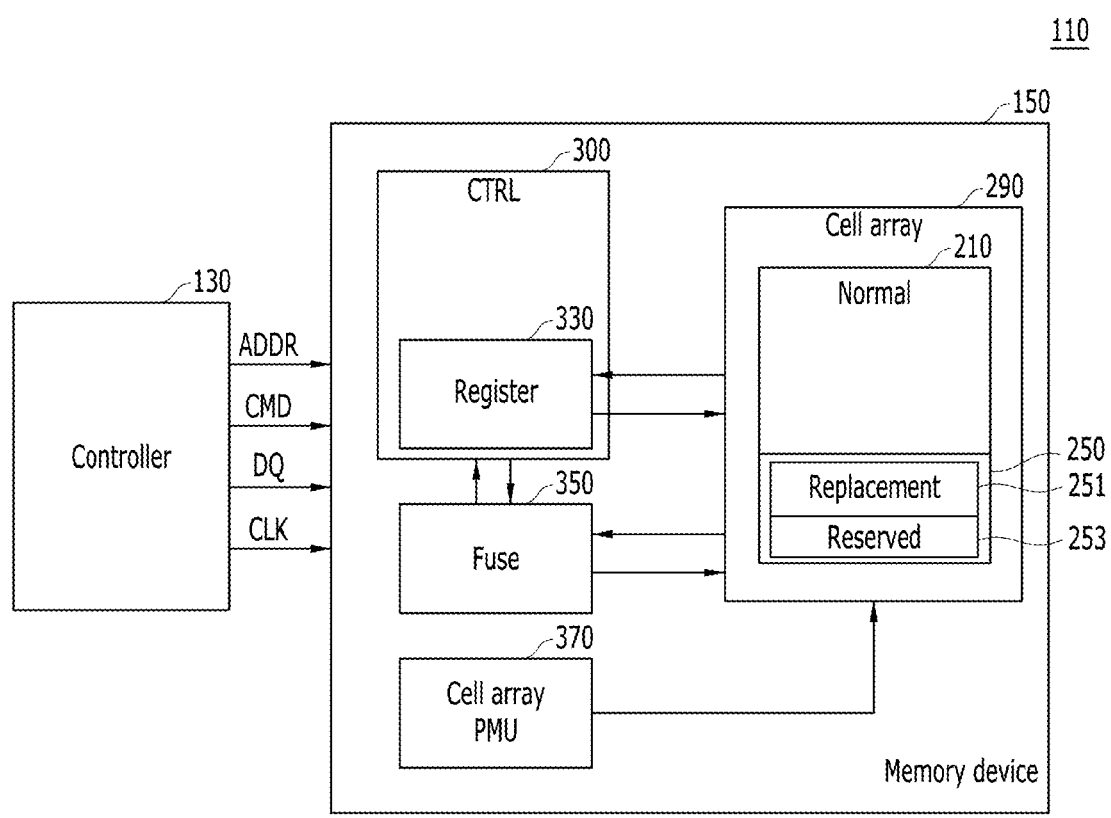
FIG. 3 is a block diagram schematically illustrating a memory system in accordance with an embodiment of the present disclosure.

FIG. 3 is a block diagram schematically illustrating the memory system 110 shown in FIG. 1 in accordance with an embodiment of the present disclosure.

Referring to FIG. 3, the memory system 110 includes the controller 130 and the memory device 150. The controller 130 may control the memory device 150 by providing the memory device 150 with an address ADDR, a command CMD, a DQ signal DQ, and a clock signal CLK.

The memory device 150 may include a memory device controller 300, a fuse unit 350, a cell array power management unit (PMU) 370, and the memory cell array 290 shown in FIG. 2. The memory device controller 300 may include a register 330 and may communicate with each of the fuse unit 350, the cell array power management unit 370, and the memory cell array 290.

The register 330 may identify the redundancy memory cell area 250 of the memory cell array 290. The register 330 may identify each of the replacement memory cell region 251 and the reserved memory cell region 253 in the redundancy memory cell area 250. The register 330 may first identify the redundancy memory cell area 250 and may generate a first signal indicating existence of the redundancy memory cell area 250. In order to activate a plurality of redundancy memory cells, the register 330 may re-set Mode Register Set (MRS) commands or may generate addresses for accessing the plurality of redundancy memory cells by activating internal circuits of the memory device 150.

The MRS commands may include commands for setting operations of the memory device 150 and commands for performing a read operation, a write operation, and a charging operation of the memory device 150.

Further, the register 330 may activate the fuse unit 350 to generate address combination for activating the plurality of redundancy memory cells, using addresses provided to the memory device 150. The register 330 may provide the first signal to the controller 130. The controller 130 may assign addresses for the plurality of redundancy memory cells included in the redundancy memory cell area 250 based on the first signal.

The register 330 may generate a second signal for accessing the reserved memory cell region 253. The register 330 may first identify the reserved memory cell region 253 and may generate the second signal indicating existence of the reserved memory cell region 253. In order to activate a plurality of reserved memory cells in the reserved memory cell region 253, the register 330 may re-set the Mode Register Set (MRS) commands or may generate addresses for accessing the plurality of reserved memory cells by activating the internal circuits of the memory device 150. Further, the register 330 may activate the fuse unit 350 to generate address combination for activating the plurality of reserved memory cells, using addresses provided to the memory device 150. The register 330 may provide the second signal to the controller 130. The controller 130 may assign addresses for the plurality of reserved memory cells included in the reserved memory cell region 253 based on the second signal.

The fuse unit 350 may receive the first and second signals, addresses transferred from the controller 130, and activation signals for activating the plurality of redundancy memory cells and the plurality of reserved memory cells from the register 330. The fuse unit 350 may activate the plurality of redundancy memory cells included in the redundancy memory cell area 250, and particularly, may activate the plurality of reserved memory cells included in the reserved memory cell region 253 and the plurality of reserved word lines RmW0 to RmWk coupled to the plurality of reserved memory cells, based on the first and second signals, the addresses transferred from the controller 130, and the activation signals for activating the plurality of redundancy memory cells and the plurality of reserved memory cells.

The memory cell array power management unit 370 may separately manage power of the normal memory cell area 210 and power of the redundancy memory cell area 250 based on control signals provided from the memory device controller 300. Particularly, the memory cell array power management unit 370 may separately manage power of the reserved memory cell region 253. Therefore, the memory cell array power management unit 370 may turn off the power of the reserved memory cell region 253 during an operation for a request, which does not use the plurality of reserved memory cells.

Figure 4:
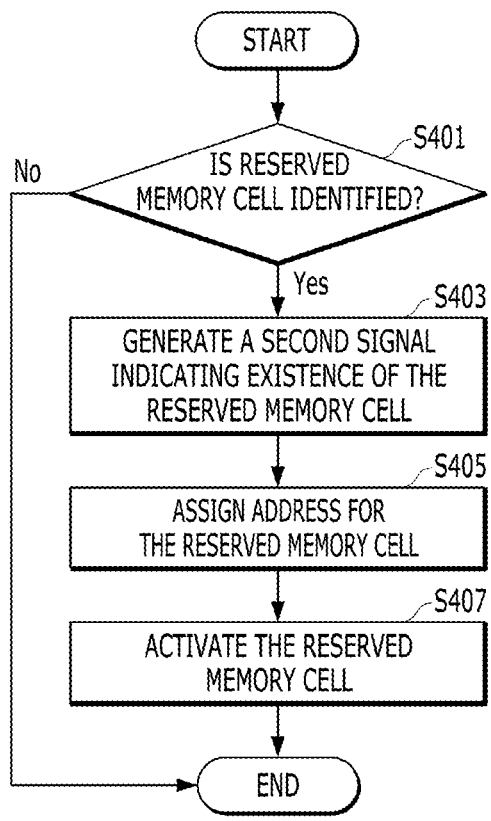
FIG. 4 is a flowchart schematically illustrating an operation of a memory system in accordance with an embodiment of the present disclosure.

FIG. 4 is a flowchart schematically illustrating an operation of the memory system 110 shown in FIG. 3 in accordance with an embodiment of the present disclosure. FIG. 4 shows an operation of utilizing the plurality of reserved memory cells included in the reserved memory cell region 253. The operation shown in FIG. 4 will be described with reference to FIG. 3.

At step S401, the register 330 may identify the reserved memory cell region 253 as well as the redundancy memory cell area 250. The size of the reserved memory cell region 253 may be changed according to a type of the memory system 110.

When the memory device 150 does not include a reserved memory cell region, i.e., the reserved memory cell region is not identified ("No" at step S401), the memory system 110 may terminate a process without performing any particular operation relating to the reserved memory cell region.

When the reserved memory cell region 253 is identified ("Yes" at step S401), the memory system 110 may perform an operation for utilizing the reserved memory cell region 253.

When the register 330 identifies the reserved memory cell region 253, at step S403, the register 330 may generate the second signal indicating existence of the reserved memory cell region 253. As described above, the second signal may be provided to fuse unit 350. Also, the second signal may be provided to the controller 130.

At step S405, the controller 130 may assign addresses for accessing the plurality of reserved memory cells included in the reserved memory cell region 253 based on the second signal, and may provide the generated addresses to the memory device 150.

At step S407, the fuse unit 350 may activate the plurality of reserved memory cells included in the reserved memory cell region 253 based on the activation signals provided from the register 330 and the addresses provided from the controller 130. The activated plurality of reserved memory cells can be used for a particular operation of the memory system 110.

Accordingly, the controller 130 may use all of the normal memory cell area 210, the replacement memory cell region 251, and the reserved memory cell region 253 as a memory space of the memory device 150.

Figure 5:
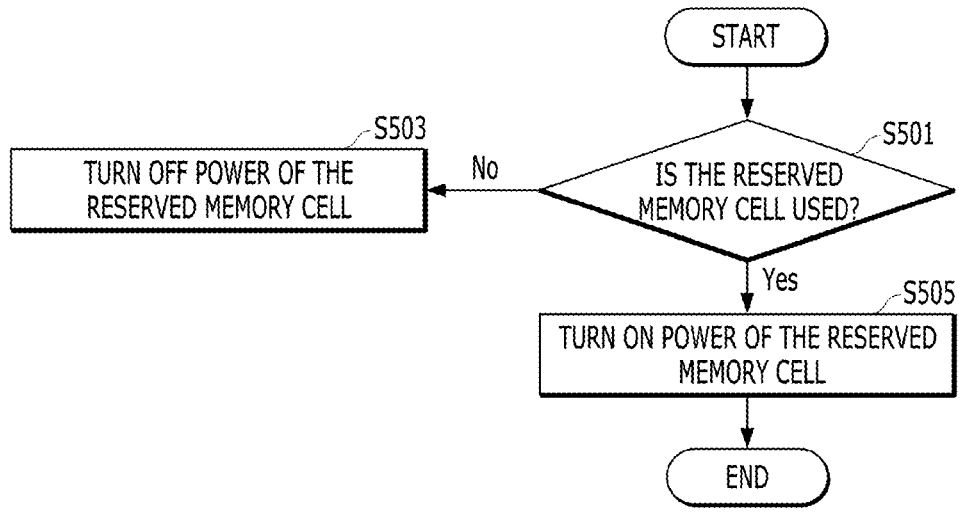
FIG. 5 is a flowchart schematically illustrating an operation of a memory system in accordance with an embodiment of the present disclosure.

FIG. 5 is a flowchart schematically illustrating an operation of the memory system 110 shown in FIG. 3 in accordance with another embodiment of the present disclosure. FIG. 5 shows an operation of processing a request according to whether the request utilizes the plurality of reserved memory cells included in the reserved memory cell region 253 or not. The operation shown in FIG. 5 will be described with reference to FIG. 3.

At step S501, the controller 130 may analyze a request provided from an external device, e.g., the host 102 shown in FIG. 1. The controller 130 may determine whether the request uses the reserved memory cell region 253 in the memory device 150.

When the request does not use the reserved memory cell region 253 ("No" at step S501), the memory cell array power management unit 370 may turn off power of the reserved memory cell region 253 under the control of the controller 130 at step S503.

When it is determined that the request uses the reserved memory cell region 253 ("Yes" at step S501), the memory cell array power management unit 370 may turn on the power of the reserved memory cell region 253 under the control of the controller 130 at step S505.

Figure 6:
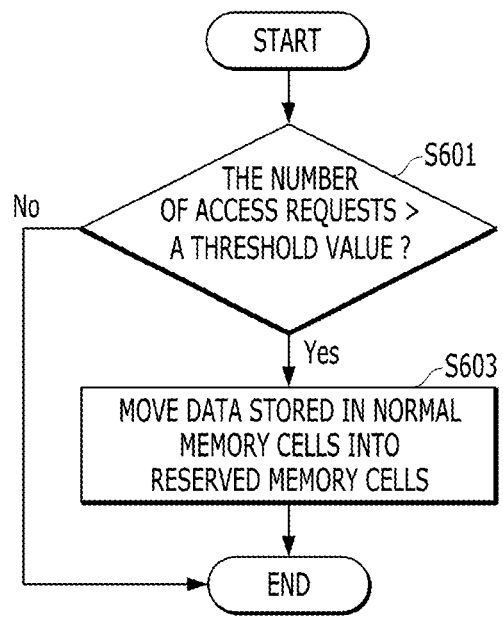
FIG. 6 is a flowchart schematically illustrating an operation of a memory system in accordance with an embodiment of the present disclosure.

FIG. 6 is a flowchart schematically illustrating an operation of the memory system 110 shown in FIG. 3 in accordance with another embodiment of the present disclosure. FIG. 6 shows an operation of overcoming the row hammering. The row hammering may occur on a neighboring word line of a particular word line when a request processing operation is repeatedly performed to the particular word line.

At step S601, the controller 130 may count the number of access requests activating each of the plurality of word lines included in the memory device 150. Particularly, the controller 130 may count the number of access requests activating each of the plurality of normal word lines NW0 to NWn in the normal memory cell area 210, and may detect a word line corresponding to the number of access requests that is greater than a predetermined threshold value, among the plurality of normal word lines NW0 to NWn in the normal memory cell area 210.

When there is no word line, corresponding to the number of access requests that is greater than the predetermined threshold value, among the plurality of normal word lines NW0 to NWn in the normal memory cell area 210 ("No" at step S601), the memory system 110 may terminate the process.

When there is detected a word line, corresponding to the number of access requests that is greater than the predetermined threshold value, among the plurality of normal word lines NW0 to NWn in the normal memory cell region 210 ("Yes" at step S601), the controller 130 may control the memory device 150 to move data stored in a multiplicity of normal memory cells coupled to the detected word line into a multiplicity of reserved memory cells coupled to a word line selected from the plurality of reserved word lines RmW0 to RmWk in the reserved memory cell region 253. The controller 130 may control the memory device 150 to copy the data stored in the multiplicity of normal memory cells coupled to the detected word line into the multiplicity of reserved memory cells coupled to the selected reserved word line, and may assign addresses for accessing the multiplicity of reserved memory cells coupled to the selected reserved word line.

As described above, the controller 130 of the memory system 110 may improve the reliability issue such as the row hammering by using the reserved memory cell region 253. That is, in the memory system 110, word lines in the normal memory cell area 210 are monitored before a problem occurs by the row hammering, an address for activating a first word line on which the problem may occur due to the row hammering is replaced with an address for activating a second word line in the reserved memory cell region 253, and data stored in normal memory cells coupled to the first word line is copied and moved to reserved memory cells coupled to the second word line. The reserved memory cells are used to prevent the row hammering from occurring in the memory system 110.

Although not illustrated, the memory system 110 in accordance with an embodiment of the present disclosure may include a plurality of memory devices. Each of the plurality of memory devices may correspond to the memory device 150 shown in FIG. 3. The controller 130 may control each of the plurality of memory devices.

In accordance with the various embodiments of the present disclosure, a memory space recognized as substantial may be increased by replacing failed memory cells in the normal memory cell area 210 with redundancy memory cells in the redundancy memory cell area 250 and by identifying the reserved memory cell region 253 of the redundancy memory cell region 250 and using the reserved memory cell region 253 for other usage. Also, in accordance with the various embodiments of the present disclosure, characteristics of the memory system 110 may be improved by increasing an amount of memory cells practically used. That is, when the capacity of a memory assigned for processing a request is insufficient, the controller 130 may additionally assign a plurality of reserved memory cells to process the request. Further, in accordance with the various embodiments of the present disclosure, the reliability of the memory system 110 may be improved by using the reserved memory cell region 253 to remove a reliability issue such as the row hammering.

While the present invention has been described with respect to specific embodiments, it will be apparent to those skilled in the art that various changes and modifications may be made without departing from the spirit and scope of the invention as determined in the following claims.

What is claimed is:

1. A data processing system comprising:
a plurality of memory devices including first and second memory devices, the first memory device having a memory cell array and a device controller, the memory cell array including a normal memory cell area and a redundancy memory cell area, the redundancy memory cell area including a replacement memory cell region and a reserved memory cell region, the replacement memory cell region including a plurality of replacement memory cells replaced with a plurality of failed memory cells included in the normal memory cell area, the reserved memory cell region including a plurality of reserved memory cells in a remaining region other than the replacement memory cell region;
a host configured to transmit a request for write and read operations to the first memory device and the second memory device; and
a memory controller configured to assign a first address to the plurality of reserved memory cells in the reserved memory cell region to enable accessing of the plurality of reserved memory cells, wherein the first address is not assigned to access the normal memory cell area and the replacement memory cell region.

2. The data processing system of claim 1, wherein the device controller is configured to generate a first signal associated with the redundancy memory cell area, the first signal indicating existence of the redundancy memory cell area, and the memory controller is configured to access the redundancy memory cell area based on the first signal.

3. The data processing system of claim 2, wherein the first memory device further comprises a fuse unit configured to activate the redundancy memory cell area based on the first address.

4. The data processing system of claim 3, wherein the first signal is provided to the fuse unit together with a Mode Register Set (MRS) signal.

5. The data processing system of claim 4, wherein the fuse unit activates the redundancy memory cell based on the first signal, the MRS signal, and the first address.

6. The data processing system of claim 1, wherein the first memory device further comprises a memory cell array power management unit that separately manages power of the redundancy memory cell area from power of the normal memory cell area.

7. The data processing system of claim 6, wherein the memory cell array power management unit turns off the power of the redundancy memory cell area unless a request uses the redundancy memory cell area.

8. The data processing system of claim 1,
wherein the device controller generates a second signal associated with the reserved memory cell region, and the memory controller assigns a second address for accessing a reserved memory cell of the reserved memory cell region based on the second signal, and
wherein a replacement memory cell in the replacement memory cell region replaces a failed memory cell in the normal memory cell area, and the reserved memory cell in the reserved memory cell region remains without replacing any failed memory cell in the normal memory cell area.

9. The data processing system of claim 8, wherein the memory controller monitors a number of access requests activating each of a plurality of word lines in the first memory device.

10. The data processing system of claim 9, wherein the memory controller controls the first memory device to copy data stored in memory cells coupled to a first word line, for which the number of access requests is greater than a threshold value, into memory cells coupled to a second word line of the reserved memory cell region, and
wherein the memory controller assigns an address for activating the first word line to the second word line.

11. The data processing system of claim 8, wherein the first memory device further includes a memory cell array power management unit that separately manages power of the reserved memory cell region from power of the normal memory cell area, and
the memory cell array power management unit turns off the power of the reserved memory cell region unless a request uses the reserved memory cell region, and
wherein, when a capacity of a memory assigned for processing a request is insufficient, the memory controller assigns the reserved memory cell to process the request.

12. The data processing system of claim 1, wherein the second memory device has a memory cell array and a device controller, the second memory cell array including a normal memory cell area and a redundancy memory cell area, the second device controller being configured to generate a third signal associated with the redundancy memory cell area of the second memory cell array, and
wherein the memory controller is provided external to the second memory device and configured to enable accessing of a redundancy memory cell of the redundancy memory cell area of the second memory device based on the third signal.

13. A method for operating a data processing system, the method comprising:
assigning, by a memory controller, a first address to a first memory device, wherein the first memory device includes a normal memory cell area and a redundancy memory cell area, the redundancy memory cell area including a replacement memory cell region and a reserved memory cell region, the replacement memory cell region including a plurality of replacement memory cells replaced with a plurality of failed memory cells included in the normal memory cell area, the reserved memory cell region including a plurality of reserved memory cells in a remaining region other than the replacement memory cell region, and wherein the first address for accessing the plurality of reserved memory cells in the reserved memory cell region is not assigned to access the normal memory cell area and the replacement memory cell region;
transmitting, by a host, a request for write and read operations to the first memory device; and
controlling, by the memory controller, the first memory device.

14. The method of claim 13, further comprising:
generating, by the first memory device, a first signal associated with the redundancy memory cell area; and
storing, by the first memory device, the first address assigned to the redundancy memory cell area in a fuse unit of the memory device,
wherein the first signal generated by the first memory device indicates existence of the redundancy memory cell area so that the memory controller assigns the first address for accessing the redundancy memory cell area based on the first signal.

15. The method of claim 14, wherein the first signal is provided to the fuse unit along with a Mode Register Set (MRS) signal, and the redundancy memory cell area is activated based on the first signal, the MRS signal, and the first address assigned to the redundancy memory cell area.

16. The method of claim 13, further comprising:
receiving, by the memory controller, a second signal associated with the reserved memory cell region in the memory cell array;
assigning, by the memory controller, a second address for accessing the plurality of reserved memory cells in the reserved memory cell region based on the second signal; and
controlling, by the memory controller, the first memory device to activate the plurality of reserved memory cells based on the second address,
wherein a replacement memory cell in the replacement memory cell region replaces a failed memory cell in the normal memory cell area, and the plurality of reserved memory cells in the reserved memory cell region remain without replacing any failed memory cell in the normal memory cell area.

17. The method of claim 16, further comprising monitoring, by the memory controller, a number of access requests activating each of a plurality of word lines in the first memory device,
wherein the controlling of the first memory device comprises controlling the first memory device to copy data stored in memory cells coupled to a first word line, for which the number of access requests is greater than a threshold value, into memory cells coupled to a second word line of the reserved memory cell region, and
wherein the method further comprises assigning, by the memory controller, an address for activating the first word line to the second word line.

18. The method of claim 16, further comprising turning off, by the memory controller, power of the reserved memory cell region unless a request uses the reserved memory cell region.

19. The method of claim 16, wherein the controlling of the first memory device comprises controlling the first memory device to assign the reserved memory cell to process a request when a capacity of a memory assigned for processing the request is insufficient.

20. The method of claim 13, further comprising:
receiving, by the memory controller, a third signal associated with a redundancy memory cell area in a memory cell array of a second memory device, the memory cell array of the second memory device including a normal memory cell area and the redundancy memory cell area, the memory controller being provided external to the second memory device;
assigning, by the memory controller, a third address for accessing a redundancy memory cell in the redundancy memory cell area of the second memory device based on the third signal; and
controlling, by the memory controller, the second memory device to activate the redundancy memory cell of the second memory device based on the third address.

* * * * *